United States Patent [19]

Ford

[11] Patent Number: 5,560,297
[45] Date of Patent: Oct. 1, 1996

[54] METHOD OF MOUNTING A PRINTING PLATE ON A MOUNTING SHEET

[75] Inventor: William J. Ford, Warrington, United Kingdom

[73] Assignee: Pamarco Europe Limited, Warrington, United Kingdom

[21] Appl. No.: 525,279

[22] Filed: Sep. 7, 1995

[51] Int. Cl.⁶ ................................................ B41M 1/12
[52] U.S. Cl. ........................ 101/486; 101/401.1; 33/621
[58] Field of Search ......................... 101/DIG. 36, 485, 101/486, 382.1, 401.1; 33/614–621

[56] References Cited

U.S. PATENT DOCUMENTS

| | | | |
|---|---|---|---|
| 3,288,063 | 11/1966 | Bungay, Jr. | 101/486 |
| 3,943,851 | 3/1976 | Inada et al. | 33/614 |
| 4,043,815 | 8/1977 | Klymus | 96/33 |
| 4,426,152 | 1/1984 | Sakamoto et al. | 335/75 |
| 4,463,673 | 8/1984 | Moore | 33/614 |

FOREIGN PATENT DOCUMENTS

| | | | |
|---|---|---|---|
| 033123 | 3/1980 | Japan | 101/DIG. 36 |
| 062189 | 4/1984 | Japan | 101/DIG. 36 |
| 038294 | 2/1989 | Japan | 101/DIG. 36 |
| 015553 | 1/1991 | Japan | 101/DIG. 36 |
| 1149203 | 4/1969 | United Kingdom . | |
| 2136332 | 9/1984 | United Kingdom . | |

*Primary Examiner*—Ren Yan
*Attorney, Agent, or Firm*—Rockey, Rifkin and Ryther

[57] ABSTRACT

A method for mounting a printing plate on a mounting sheet without requiring the intervention of a skilled person working by eye. An original design to be printed is produced on a computer and register marks are added to that design at specific positions. The resultant design data is output to a first printer. A negative of the design and the register marks is produced, and a printing plate is produced from the negative so that the design and the register marks are reproduced on the printing plate. The register mark position data is also output from the computer to a second printer. The dimensions of an article upon which the design is to be printed are input into a second printer and a full size plot of the outline of the article, including the positions of the register marks, is produced from the second printer. The plot is then located in a predetermined overlapping position relative to the mounting sheet on which it is desired to mount the printing plate and the printing plate is secured on the mounting sheet such that the register marks reproduced on the printing plate are aligned with the register marks on the plot.

8 Claims, 3 Drawing Sheets

METHOD OF MOUNTING A PRINTING PLATE ON A MOUNTING SHEET

BACKGROUND OF THE INVENTION

The present invention relates to a method of mounting a printing plate to a mounting sheet, the mounting sheet facilitating subsequent mounting of the plate to a printing apparatus such as a printing roller.

The process of mounting printing plates to a backing sheet is known as pre-mounting. In the packaging production industry, for example, in which pre-mounted printing sheets are produced to enable a printer to print images onto packaging, such as for instance cardboard boxes, the established method of producing and pre-mounting printing plates is as follows.

The original artwork is first produced on a computer using a suitable CAD software package. Typically the artwork will comprise a number of multi-coloured designs for printing on different panels of a cardboard box. Once finalised, the computer panel design data is supplied to a printer for the production of full sized negative prints of the panel designs which are subsequently used to produce the printing plates. Since the printing process requires a separate set of plates for each colour to be printed, at the artwork production stage each different colour used in the panel designs is flagged as such by the software so that separate sets of negative prints can be produced for each individual colour.

The negative prints are then used to produce relief printing plates for each panel design from photo-polymer. These plates are then pre-mounted before sending to the printer. The plates for each individual colour are mounted on separate backing sheets which are generally all of the same size. The backing sheets are of a standard size and are provided with register holes or other alignment formations for fixing in a predetermined position on the printing rollers. The backing sheets and rollers generally have centre marks so that the printer can accurately align the separate backing sheets carrying the different colour plates.

It will be appreciated that although the printer can align the separate sheets with one another, the plates for each colour must be accurately positioned on respective backing sheets at the pre-mounting stage so that at the printing stage they are correctly positioned relative to one another once the backing sheets are aligned. For instance if each sheet carries a single plate each plate must be positioned at the identical position on its respective sheet to the position of the other plates on their backing sheets.

Such accurate pre-mounting is achieved as follows. The first sheet is placed on a laying up board in a set position for instance by locating one corner of the sheet within a right angle. This ensures that successive sheets can be positioned on the board in the identical position.

The dimensions of the cardboard blank, for instance, which the design is to be printed on is fed into a plotter which produces a full size plot of the blank on a sheet of tracing paper. This sheet of tracing paper is laid over the backing sheet and secured against unwanted movement by taping one edge of the sheet to the board.

The printing plate or plates of the first colour are then slipped under the tracing paper and fixed to the backing sheet. The correct position of the first colour plate or plates is determined by eye with reference to the outline of the blank carried by the tracing paper. Register marks are then made on the tracing paper to indicate the positioning of the first colour plate or plates.

The first backing sheet is then successively replaced with subsequent backing sheets of identical size and which are positioned on the board in the same position as the first in the manner discussed above. The tracing paper being taped to the board will remain in the same position. Subsequent colour plates are then fixed to respective backing sheets, the register marks made on the tracing paper after the first colour was mounted being used to help correctly align each colours plates with the first colours plates and with each other. For instance if an identical number and size of plates is used for each colour the mounting of the second and subsequent colour plates will be a simple matter of aligning those plates exactly with the register marks made after the first colour plates are mounted. It will however be appreciated that great care must be employed by a skilled worker in positioning the first colour plates as this is done by eye with reference only to the outline of the blank.

In addition, any single colour will often only appear at distinct spaced apart portions of any given panel design. In this case, since the cost of the photo-resin is high, it is not economical to produce a single printing plate for each colour for each panel design but rather a number of smaller plates are produced for respective localised areas of any one colour. Thus in general there will be a number of separate plates for each colour of any one panel design. This complicates the pre-mounting task since each plate of the first colour must be positioned accurately, by eye, relative to each other as well as to the outline of the blank.

Moreover, there will often be different numbers of different sized plates for each colour and therefore whilst the register marks of the first colour plates will aid in positioning subsequent colour plates, the positions of the subsequent colour plates may not correspond exactly with the register marks.

Since as many as 100 plates may be used for all the colours for any one blank it will be appreciated that the established method of pre-mounting is difficult and time consuming requiring painstaking work by a skilled worker. Thus even if the design consists of only a single colour the process of pre-mounting the plates in the correct relative positions by eye alone can be a difficult and time consuming procedure.

Plate mounting machines have been developed for pre-mounting, such as that sold by J. M. Heaford Limited under the trade mark VIPER, which employ video cameras to help position the plates. However, such machines are generally expensive, typically costing tens of thousands of pounds, and the number of plates which can be mounted is limited. For instance, the VIPER (trade mark) machine referred to can be used to mount a maximum of twelve plates only.

It is an object of the present invention to obviate or mitigate the above disadvantages.

SUMMARY OF THE INVENTION

According to the present invention there is provided a method for mounting a printing plate on a mounting sheet, the method comprising the steps of:

a) producing on a computer an original design to be printed, b) adding register marks to the design at specific positions, c) outputting the design data, including the register mark position data, to a first printer, d) producing a negative of the design and the register marks, e) producing a printing plate using the negative so that the design and the register marks are reproduced on the printing plate, f) outputting the register mark position data to a second printer, g) inputting into said second printer the dimensions of an article upon which the design is to be printed, h) producing, from the second printer, a full size plot of the outline of the article including the positions of the register marks, i) locating the plot in a predetermined overlapping position relative to the mounting sheet on which it is desired to mount the printing plate, and j) securing the printing plate on the mounting sheet such that the register marks reproduced on the printing plate are aligned with the register marks on the plot.

Since the plot carries register marks corresponding with register marks on the printing plate, accurate positioning of the plate on the mounting sheet is a straightforward matter not depending on the skill of the pre-mounter to position the plate by eye.

Preferably data relating to the dimensions of the article on which the design is to be printed is input into the computer at the design stage, the dimension data being output from the computer to the second printer together with the register mark position data.

The method may be used where there are a plurality of printing plates to be mounted to a single mounting sheet, respective register marks being allocated at the design stage to each plate.

The method may also be used where the design comprises a plurality of colours such that separate printing plates relating to each colour are required, respective register marks being allocated to each printing plate at the design stage, and the plot includes all register marks relating to all colours.

At least some of the register marks relating to different plates may be identified as such to aid in matching up specific plates with specific register marks carried by the plot at the mounting stage.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
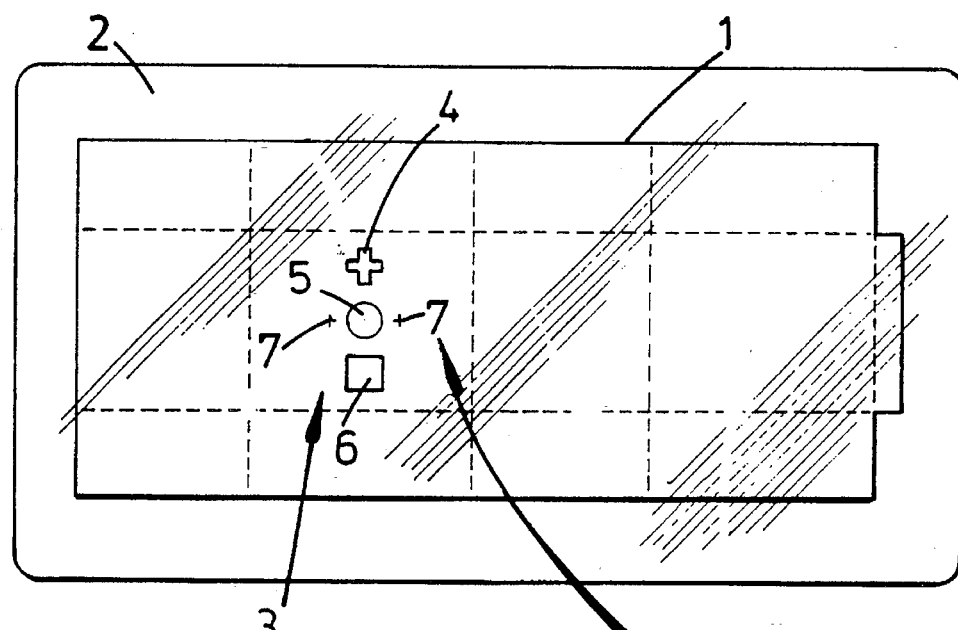
FIG. 1 illustrates a design shown on a computer screen after preparation on a computer, in accordance with the present invention.

Referring to the drawings, the described embodiment of the present invention relates to the production and mounting of printing plates for printing a design on a cardboard box. Initially the dimensions of the cardboard box blank are fed into a computer (not shown) and the outline of the blank 1 is displayed on a computer screen 2. The artwork for the design of the various panels of the box is then produced on the computer, and displayed on the computer screen 2. In the illustrated example the design of only one box panel is shown, this is referenced as the panel design 3.

The panel design 3 comprises a red cross 4, a black circle 5 and a red square 6. Once the design is completed the designer adds to the design register marks 7. Thus there is one pair of register marks 7 which is effective for the cross 4, the circle 5 and the square 6. It will be appreciated that the design illustrated and described is very simple in order to simplify the description of the invention and that in practice the design may be much more complex and include a large number of colours.

Although each colour of the panel design 3 together with the outline 1 of the cardboard box and the register mark 7 are displayed on the screen simultaneously, the software program is such that the data relating to each colour and to the outline 1 exists at different levels of the program but that the data relating to the register marks 7 exists on every level of the program. A software package which may be adapted to carry out the present invention is sold by F.S.L Computer Services Division (of Oakwood Avenue, Warrington, Cheshire, England) as "Package Express" software. However, once the important features of the present invention are understood from the following description, it will be a straightforward matter for a computer programmer to develop suitable software for performing the invention. Accordingly further details of the computer software are not given here.

Once the design is complete the data relating to the panel design 3 is fed to a first printer (not shown). It is to be noted that data describing the position of the register marks 7, which data exists at every level of the program, is input to the printer together with the panel design data, but that the data relating to the dimensions and outline 1 of the blank, which exists at a different level of the software, is not.

Figure 2:
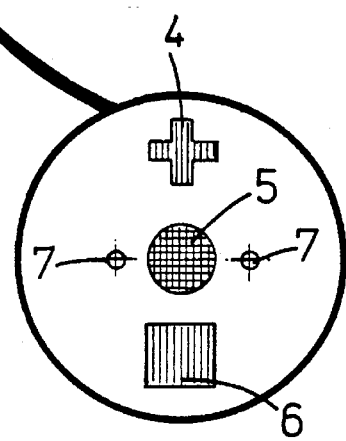
FIG. 2 shows design negatives produced by a printer from design data relating to the design shown in FIG. 1 and obtained from the computer.
Figure 2:
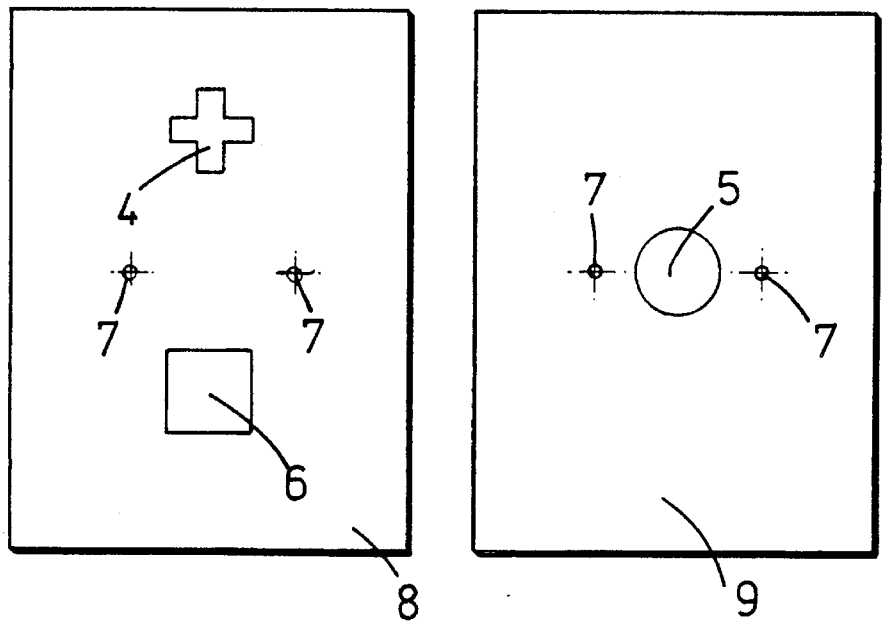

The first printer is used to produce full size negatives 8 and 9 (shown in FIG. 2) of the panel design 3. Separate negatives are produced for each colour layer of the panel design 3. Thus, referring to FIG. 2, the negative print 8 relates to the red portions of the design and the negative print 9 relates to the black portions of the panel design 3. It will be seen, however, that the register marks 7 come out on each negative 8 and 9 irrespective of the colour to which that negative relates.

Figure 3:
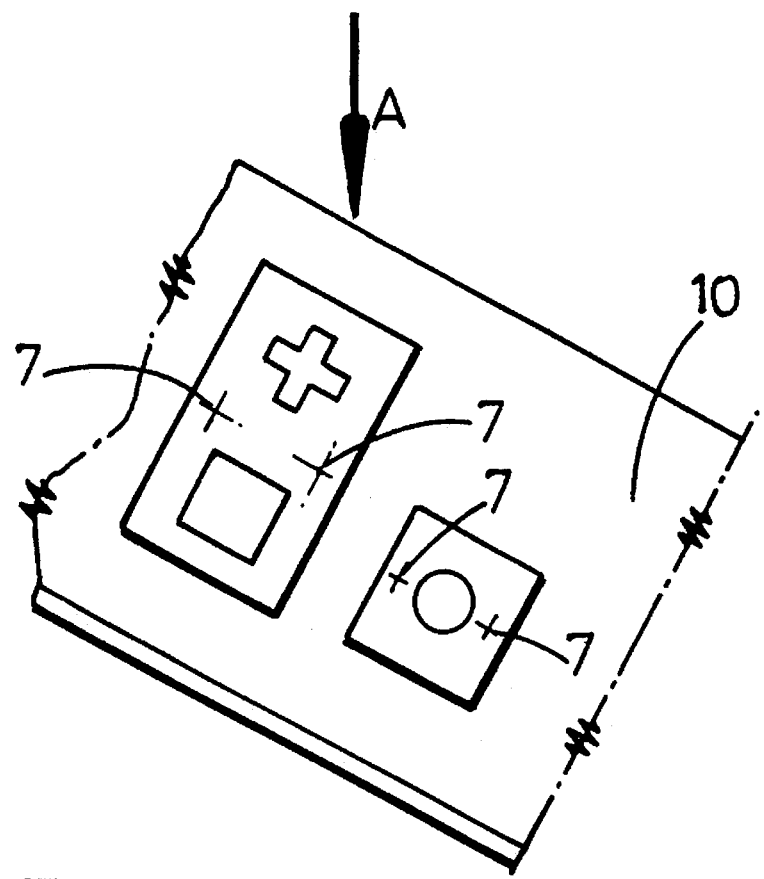
FIG. 3 illustrates the manner in which the negatives of FIG. 2 are used in the production of printing plates from a photo-polymer sheet.
Figure 4:
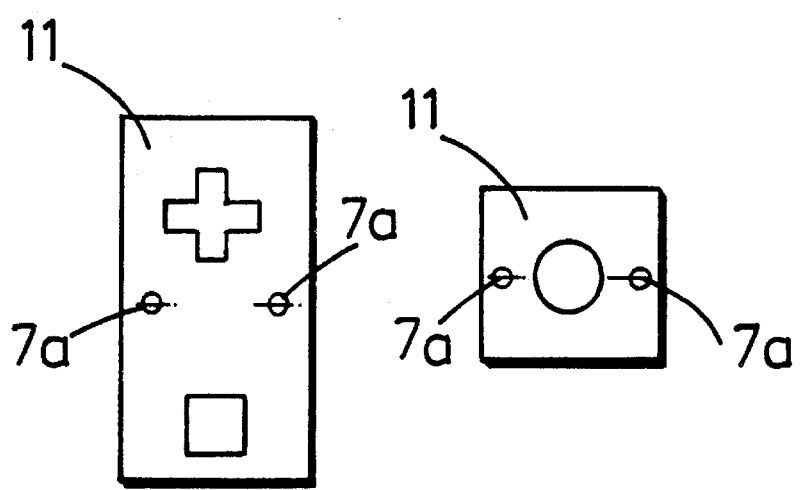
FIG. 4 shows finished printing plates.

The negatives 8 and 9 are then used in the production of printing plates from a photo-polymer sheet in accordance with a known method. Referring to FIG. 3, the negatives are laid over a photo-polymer sheet 10 which is then exposed to light (indicated by the arrow A). Wherever light passes through the negative and strikes the sheet 10 the surface of the sheet raises up to produce the appropriate design in relief. The resultant printing plates 11 are shown in FIG. 4, after they have been cut from the sheet 10. Not only are the respective portions of the panel design 3 reproduced on the sheet 10, but also each corresponding pair of register marks 7, referenced 7a.

The photo-polymer material is very expensive and the sheets tend to be of a standard size. Hence before the negatives are laid up on the photo-polymer sheet 10 the original negatives 8 and 9 are cut into smaller portions to eliminate some of those portions of the original negatives which will not contribute to the reproduction of the design on the sheet 10, in order to minimise the area of the photo-polymer sheet 10 required to produce the plates. It will be appreciated that, again in the interest of efficiency, a single photo-polymer sheet 10 will not be exposed until the whole sheet has been covered with negatives which may or may not relate to the same design.

Figure 5:
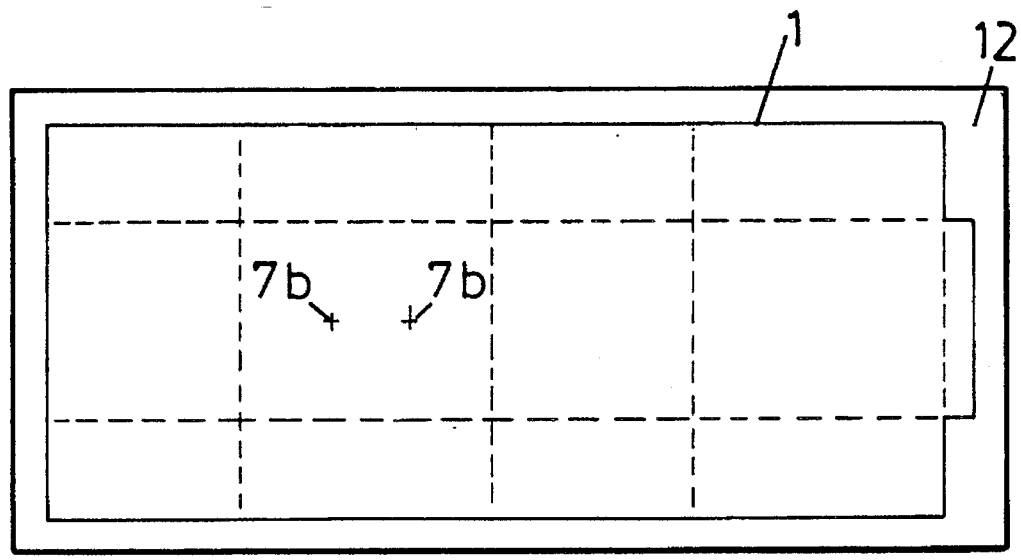
FIG. 5 shows a plot of the outline of an article on which the design of FIG. 1 is to be printed.

Referring to FIG. 5, data relating to the dimensions of the blank together with the data representing the positions of the register marks 7 are then output from the computer to a plotter (not shown) which is used to produce a full sized plot of the outline 1 of the box blank on tracing paper 12. The plot 12 includes the register marks 7, referenced as 7b. The plot 12 is then used in the pre-mounting process as described below.

Figure 6:
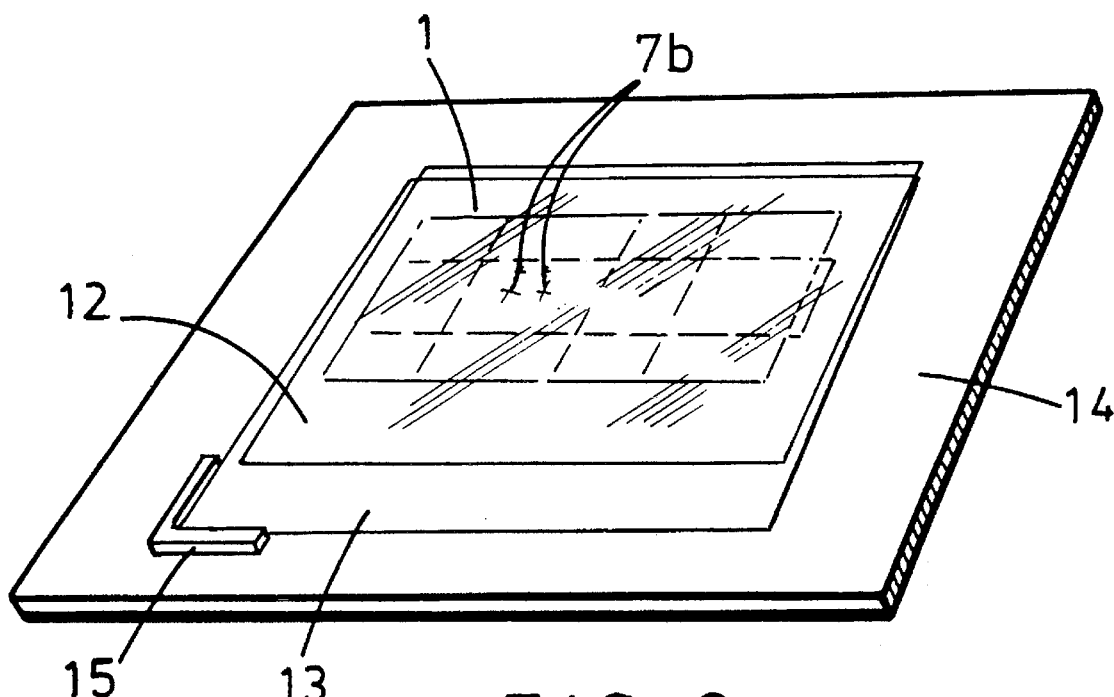
FIG. 6 illustrates the manner in which printing plates are pre-mounted to a mounting sheet.

Referring to FIG. 6, a plastics mounting sheet 13 of standard size is positioned on a laying up board 14 in a predetermined position by locating one corner of the mounting sheet 13 within a right angle 15. The tracing paper plot 12 is then laid over the carrying sheet 13 in the desired position and one edge of the tracing paper plot 12 is taped to the board 14 to prevent it being moved out of position. Next, each of the printing plates 11 is in turn inserted between the tracing paper plot 12 and the mounting sheet 13 and located in its correct position by aligning the register marks 7a on the printing plate 11 with the corresponding register marks 7b on the tracing paper plot 12. Once correctly positioned the printing plate 11 is secured on the mounting sheet 13 using adhesive tape. This process is repeated for each printing plate 11, each plate being readily located on a separate mounting sheet in the correct position be aligning the respective register marks 7a and 7b.

Once the printing plates relating to the first colour, i.e. red, have been mounted onto a single mounting sheet 13, that mounting sheet is removed from the laying up board 14 without disturbing the position of the tracing paper plot 12, which is taped to the board 14, and replaced with a second mounting sheet (not shown). The second (and subsequent sheets if more than two colour are used for the design) is of identical size to the first and is positioned in the same predetermined position on the board 14 again using the right angle 15 to locate one corner of the mounting sheet. Printing plates relating to the second colour, in this case black, are then mounted on the second carrying sheet, again being correctly positioned by aligning the respective register marks 7a and 7b.

Once the printing plates 11 have been pre-mounted they are sent to a printer. The printing process may be a conventional process such as that discussed in the introduction to this specification.

It will be appreciated that using the method in accordance with the present invention, the pre-mounting process is greatly simplified and is no longer required to be carried out by a skilled worker who must align at least the first set of printing plates by eye alone. Using the method according to the present invention it is a straightforward matter to correctly position the first, and any subsequent, set of plates in relation to one another and in relation to the outline of the box blank.

In the illustrated example, two register marks are provided. This is the preferred arrangement. However a single register mark might only be required for each plate by, for example, forming the register mark as an arrow pointing in a predetermined direction, whereby overlaying exactly the single register marks carried by the printing plates and the tracing paper plot the respective printing plate will be correctly positioned.

At the design stage register marks relating to different areas of the design may be identified as such so that at the pre-mounting stage the printing plates can more readily be identified as corresponding to specific register marks on the tracing paper plot. This would be particularly useful where large numbers of printing plates and/or colours are required.

It will be understood that although the invention has been described in relation to a design intended for printing on a cardboard box the invention is not so limited and could be applied to the pre-mounting of printing plates for printing designs on a wide range of articles.

I claim:

1. A method for mounting a printing plate on a mounting sheet, the method comprising the steps of:

a) producing on a computer an original design to be printed, b) adding register marks to the design at specific positions, c) outputting the design data, including the register mark position data, to a first printer, d) producing a negative of the design and the register marks, e) producing a printing plate using the negative so that the design and the register marks are reproduced on the printing plate, f) outputting the register mark position data to a second printer, g) inputting into said second printer the dimensions of an article upon which the design is to be printed, h) producing, from the second printer, a full size plot of the outline of the article including the positions of the register marks, i) locating the plot in a predetermined overlapping position relative to the mounting sheet on which it is desired to mount the printing plate, and j) securing the printing plate on the mounting sheet such that the register marks reproduced on the printing plate are aligned with the register marks on the plot.

2. A method according to claim 1, wherein the dimensions of the article on which the design is to be printed are input into the computer at the design stage, the dimension data being output from the computer to the second printer together with the register mark position data.

3. A method according to claim 1, wherein there are a plurality of printing plates to be mounted to a single printing roller, respective register marks being allocated at the design stage to each plate.

4. A method according to claim 1, wherein the design comprises a plurality of colours such that separate printing plates relating to each colour are required, common register marks being allocated to the printing plates at the design stage.

5. A method according to claim 3, wherein at least some of the register marks relating to different plates are identified as such to aid in matching up specific plates with corresponding register marks carried by the plot at the mounting stage.

6. A method according to claim 4 wherein at least some of the register marks relating to different plates are identified as such to aid in matching up specific plates with corresponding register marks carried by the plot at the mounting stage.

7. A method according to claim 1, wherein the plot is produced on tracing paper.

8. A method according to claim 1, wherein the printing plates are fabricated from a photo-polymer.

\* \* \* \* \*